(12) United States Patent
Pennec

(10) Patent No.: US 8,064,852 B2
(45) Date of Patent: Nov. 22, 2011

(54) METHODS AND APPARATUS FOR DYNAMICALLY COMPENSATING FOR DC OFFSET DRIFT AND OTHER PVT-RELATED SIGNAL VARIATIONS IN POLAR TRANSMITTERS

(75) Inventor: Christian Pennec, Cupertino, CA (US)

(73) Assignee: Panasonic Corporation, Osaka (JP)

( * ) Notice: Subject to any disclaimer, the term of this patent is extended or adjusted under 35 U.S.C. 154(b) by 520 days.

(21) Appl. No.: 12/270,158

(22) Filed: Nov. 13, 2008

(65) Prior Publication Data

US 2010/0120384 A1   May 13, 2010

(51) Int. Cl.
*H04B 1/04* (2006.01)
(52) U.S. Cl. .................. 455/126; 455/114.1
(58) Field of Classification Search .................. None
See application file for complete search history.

(56) References Cited

U.S. PATENT DOCUMENTS

| 7,394,311 | B2* | 7/2008 | Jeckeln et al. | 330/10 |
| 7,509,102 | B2* | 3/2009 | Rofougaran et al. | 455/127.1 |
| 7,778,352 | B2* | 8/2010 | Jensen et al. | 375/297 |
| 2008/0072025 | A1* | 3/2008 | Staszewski et al. | 712/241 |
| 2008/0080549 | A1* | 4/2008 | Rofougaran | 370/458 |

* cited by examiner

*Primary Examiner* — Cassandra Cox

(57) ABSTRACT

Methods and apparatus for dynamically compensating for signal variations in communications transmitters employing switch-mode PAs. An exemplary method includes first identifying a predetermined signal characteristic in an input signal applied to an input of a switch-mode PA. A modulated signal produced at the output of the switch-mode PA containing the identified signal characteristic is then sampled at approximately the same time the identified signal characteristic appears at the output of the switch-mode PA, to generate a digital sample representing an actual value of the identified signal characteristic. An error signal representing the extent to which the actual value deviates from an expected value is then generated. Finally, the DC level and/or gain of the input signal to the switch-mode PA is modified to reduce the error. By reducing the error in this manner, signal variations that adversely affect the accuracy of the switch-mode PA output signal are dynamically compensated for.

23 Claims, 10 Drawing Sheets

| Amplitude/Offset DAC Input | RF Output Power | ADC Output (Expected Value) |
|---|---|---|
| DAC1 | P1 | ADC1 |
| DAC2 | P2 | ADC2 |
| ⋮ | ⋮ | ⋮ |
| DACn-1 | Pn-1 | ADCn-1 |
| DACn | Pn | ADCn |

FIGURE 7

METHODS AND APPARATUS FOR DYNAMICALLY COMPENSATING FOR DC OFFSET DRIFT AND OTHER PVT-RELATED SIGNAL VARIATIONS IN POLAR TRANSMITTERS

FIELD OF THE INVENTION

The present invention relates to switch-mode power amplifiers (PAs) and polar transmitters. More specifically, the present invention relates to methods and apparatus for dynamically compensating for direct current (DC) offset drift in switch-mode PAs, and compensating for other process-voltage-temperature (PVT) related signal variations in polar transmitters.

BACKGROUND OF THE INVENTION

Wireless communication devices, such as cellular handsets and wireless personal digital assistants, continue to gain widespread use in today's world. With each new generation of wireless communication technology, they have become more technically sophisticated, now commonly providing or supporting, in addition to traditional voice communications, text messaging, electronic mail, mini browsers for surfing the Internet, etc. While users no doubt enjoy the benefits these additional features provide, the additional features can seriously impact battery life.

Efforts to extend battery life focus in large part on ways to improve the energy efficiency of the wireless communication device's RF transmitter, particularly the RF transmitter's power amplifier (RFPA), since the RFPA is usually the dominant energy consumer. Unfortunately, these efforts are complicated by the fact that many wireless communication systems employ nonconstant-envelope modulation schemes. Nonconstant-envelope modulation schemes are used to increase spectral efficiency, i.e., to increase the amount of information that can be transmitted in a given bandwidth of the RF spectrum. However, their use also hinders the ability to increase the energy efficiency of conventional RF transmitters (e.g., quadrature modulator based RF transmitters).

When nonconstant-envelope modulation schemes are used in conventional RF transmitters, the output power of the RF transmitter's RFPA must be backed off to prevent the RFPA from clipping the nonconstant-envelope signals. Maintaining linearity also requires that the RFPA be configured to operate exclusively in its linear region of operation (i.e., that a 'linear RFPA' be used). Failure to back off the output power and use a linear RFPA results in signal distortion at the output of the RFPA. The signal distortion makes it difficult to comply with noise limitation specifications imposed by communications standards.

The need to back off output power and use a linear RFPA undesirably results in a sacrifice of energy efficiency for linearity. Fortunately, an alternative type of transmitter, commonly known as a polar transmitter, is available. A polar transmitter avoids the efficiency versus linearity trade-off by temporarily removing the amplitude modulation from the nonconstant-envelope signal. The constant-envelope signal that remains contains only phase modulation. It is translated to RF to create a constant-envelope phase-modulated RF signal and then amplified by the RF transmitter's RFPA. Because the constant-envelope phase-modulated RF signal has a constant envelope, there is no risk of signal peak clipping and the polar transmitter's RFPA can be implemented as a highly efficient nonlinear RFPA.

As the phase-modulated constant-envelope RF signal is amplified by the nonlinear RFPA, the power supply port of the nonlinear RFPA is modulated by a time-varying (i.e., dynamic) power supply containing the signal envelope. In effect, the nonlinear RFPA operates as an amplitude modulator, superimposing the signal envelope onto the phase-modulated constant-envelope RF signal, to form the desired amplitude- and phase-modulated RF output signal at the RF output of the nonlinear RFPA.

To maximize efficiency, the nonlinear RFPA is usually implemented as a switch-mode RFPA. As shown in FIG. 1, a switch-mode RFPA 100 comprises a transistor 102, typically a bipolar transistor of some sort (although field-effect transistors (FETs) are alternatively used), an RF choke 104, a bias resistor 106, and a matching network 108. The base of the transistor 102 is configured to receive the phase-modulated constant-envelope RF signal; the collector is configured to receive a dynamic power supply voltage $V_{PA}$ containing the signal envelope (via the RF choke 104); and the emitter is coupled to ground via the bias resistor 106. The RF choke 104 is used to prevent RF energy from filtering into the power supply circuitry used to generate the dynamic power supply voltage $V_{PA}$. The matching network 108 operates to block harmonic components from reaching the load 110 (the antenna of the polar transmitter) and to shape the amplitude- and phase-modulated RF signal to its desired signal characteristics.

The transistor 102 of the switch-mode RFPA 100 can be viewed as a switch, as illustrated in FIG. 2. The transistor 102 is switched ON (closed) and OFF (open), between saturation and cut-off, in response to the constant-envelope phase-modulated RF signal applied to the base of the transistor 102. Ideally, when the transistor 102 is ON, no voltage is dropped across the collector-emitter terminals of the transistor 102, and when the transistor 102 is OFF, no collector current $I_C$ flows through the transistor 102. Hence, at least in theory, the collector-emitter voltage $V_{CE}$ and collector current $I_C$ waveforms do not overlap in time and the switch-mode RFPA 100 achieves very high efficiency.

The transistor 102 of the switch-mode RFPA 100 typically comprises a bipolar transistor, such as a heterojunction bipolar transistor (HBT). Bipolar transistors exhibit a nonzero collector-emitter saturation voltage $V_{CE,SAT}$ when the transistor 102 is in the ON state, as shown in the characteristic curves of a typical bipolar transistor in FIG. 3. Note that in the ON state, the collector current $I_C$ and collector-emitter saturation voltage $V_{CE,SAT}$ are both nonzero. Further, in the OFF state the transistor 102 still passes a small amount of collector current (i.e., the transistor 102 does not serve as a completely open switch). Accordingly, unlike the ideal case discussed above, the collector current $I_C$ and collector-emitter voltage waveforms do overlap to some extent, both in the ON and OFF states, and the switch-mode RFPA 100 does not achieve the theoretical 100% efficiency. Despite the reduction in efficiency, the switch-mode RFPA 100 is still significantly more efficient than linear RFPAs.

Although the reduction in efficiency of the switch-mode RFPA 100 due to the nonzero collector-emitter saturation voltage $V_{CE,SAT}$ may be tolerable in many applications, the presence of the collector-emitter saturation voltage $V_{CE,SAT}$ can cause other problems that may not be tolerable. One particularly significant problem relates to the DC offset voltage that forms at the collector of the transistor 102 due to the nonzero collector-emitter saturation voltage $V_{CE,SAT}$ of the transistor 102 in the ON state. For example, when the switch-mode RFPA 100 is employed in a polar transmitter, the DC offset voltage can cause envelope inaccuracies in the signal envelope of the amplitude- and phase modulated RF output signal. This problem is further complicated by the fact that the DC offset voltage tends to drift with temperature, usually varies from part-to-part, and changes as the switch-mode RFPA ages. DC offset voltage drift (or "DC offset drift" for short) is highly undesirable since the distortion it causes to the signal envelope of the envelope of the amplitude- and phase modulated RF output signal results in a reduction in modulation accuracy and an increase in spectral regrowth into adjacent communications channels. The effects on the modulation accuracy and the increase in spectral regrowth can be severe enough that compliance with communications standards is difficult or impossible to achieve.

Various approaches to compensating for DC offset drift have been proposed. However, they have a number of drawbacks. One approach employs a thermal probe and a behavioral model determined in the laboratory to determine a temperature dependent voltage function, which is then used to compensate for DC offset drift. However, in addition to the drawback of having to use a thermal probe, that approach does not adequately account for part-to-part variations and requires multiple temperature measurements and/or expensive sorting procedures, which are not well suited for a mass production environment. Other approaches not requiring the use of a thermal probe have been proposed. However, those approaches require sophisticated and expensive wideband power detectors capable of providing a continuous and linear response over a wide dynamic range, as well as complex filtering mechanisms to prevent RF energy from the switch-mode RFPA from interfering with other circuitry of the transmitter.

It would be desirable, therefore, to have methods and apparatus for dynamically compensating for DC offset drift and other process, voltage, and temperature related signal variations in switch-mode power amplifiers (PAs) and in polar transmitters employing switch-mode PAs, which avoid the drawbacks and limitations of conventional DC offset drift compensation approaches.

SUMMARY OF THE INVENTION

Methods and apparatus for dynamically compensating for direct current (DC) drift and other process-voltage-temperature (PVT) related signal variations in communications transmitters employing switch-mode power amplifier (PAs) are disclosed. An exemplary method includes first identifying a predetermined signal characteristic in an input signal applied to an input of a switch-mode PA. A modulated signal produced at the output of the switch-mode PA containing the identified predetermined signal characteristic is then sampled at approximately the same time the identified predetermined signal characteristic appears at the output of the switch-mode PA, to generate a digital sample representing an actual value of the identified predetermined signal characteristic. An error signal representing the extent to which the actual value deviates from an expected value is then generated. Finally, the DC level and/or gain of the input signal to the switch-mode PA is modified to reduce the error. By reducing the error in this manner, signal variations adversely affecting the accuracy of the switch-mode PA output signal, such as those caused by PVT-related influences, are dynamically compensated for.

The methods and apparatus of the present invention have various advantages and benefits over other DC offset drift compensation approaches. First, they do not rely on models, characterizations, or estimates. Second, they neither require the use of a thermal probe nor are subject to temperature related sorting procedures. Third, the ability to dynamically adjust the magnitude and/or amplitude of signals during operation, to counter DC offset drift and other PVT-related influences, greatly simplifies factory calibration. Only a limited number of power measurements at ambient temperature need to be taken and recorded. Fourth, the methods and apparatus of the present invention do not require a closed-loop polar architecture. Instead, all that is needed to perform the compensation methods of the present invention is the addition of a simple calibration loop. Hence, the benefits of open-loop polar architectures can continue to be enjoyed. Finally, although not lastly, the methods and apparatus of the present invention are computationally efficient, energy efficient and flexible. In many circumstances, compensation for DC offset drift and/or other PVT-related signal variations can be accomplished based on a single digital sample of the detector output. This reduces the computational load of the baseband processor and conserves energy. Nevertheless, multiple-sample processing remains available, to provide flexibility and achieve higher compensation accuracy if it is desired.

Further features and advantages of the present invention, including a description of the structure and operation of the above-summarized and other exemplary embodiments of the invention, are described in detail below with respect to accompanying drawings, in which like reference numbers are used to indicate identical or functionally similar elements.

BRIEF DESCRIPTION OF THE DRAWINGS

FIG. 7 is a drawing of a look up table (LUT) configured to store digital representations of a plurality of expected values (i.e., ADC1, ADC2, . . . , ADCn-1, ADCn) for a corresponding plurality of measured output powers P1, P2, . . . , Pn-1, Pn the polar transmitter in FIG. 4 can be configured to transmit;

DETAILED DESCRIPTION

The present invention is directed at methods and apparatus that dynamically compensate for direct current (DC) offset drift and other process-voltage-temperature (PVT)-related signal variations in switch-mode power amplifiers (PAs) and in polar transmitters employing switch-mode PAs. The exemplary embodiments of the invention are described in the context of compensating for DC offset drift and other undesired signal variations in switch-mode radio frequency PAs (RF-PAs) employed in RF polar transmitters. However, the methods and apparatus are not limited to power applications, to polar transmitters, or to wireless transmitters. They may be adapted for use in non-power applications, are applicable to other types of transmitters (i.e., other than polar transmitters) that employ switch-mode RFPAs, and may be adapted for use in wired transmitters, such as wired transmitters configured to transmit over a fiber optic link. Further, although the methods and apparatus of the present invention are well-suited for use in transmitters configured to operate in accordance with non-constant-envelope modulation schemes, they may also be used in transmitters configured to operate according to constant-envelope modulation schemes.

Reference will now be made in detail to various exemplary embodiments of the invention. Those of ordinary skill in the art will realize that the exemplary embodiments are provided for illustrative purposes only, and are not intended to limit scope of the invention. Other embodiments of the invention will readily suggest themselves to such skilled persons having the benefit of this disclosure.

Figure 1:
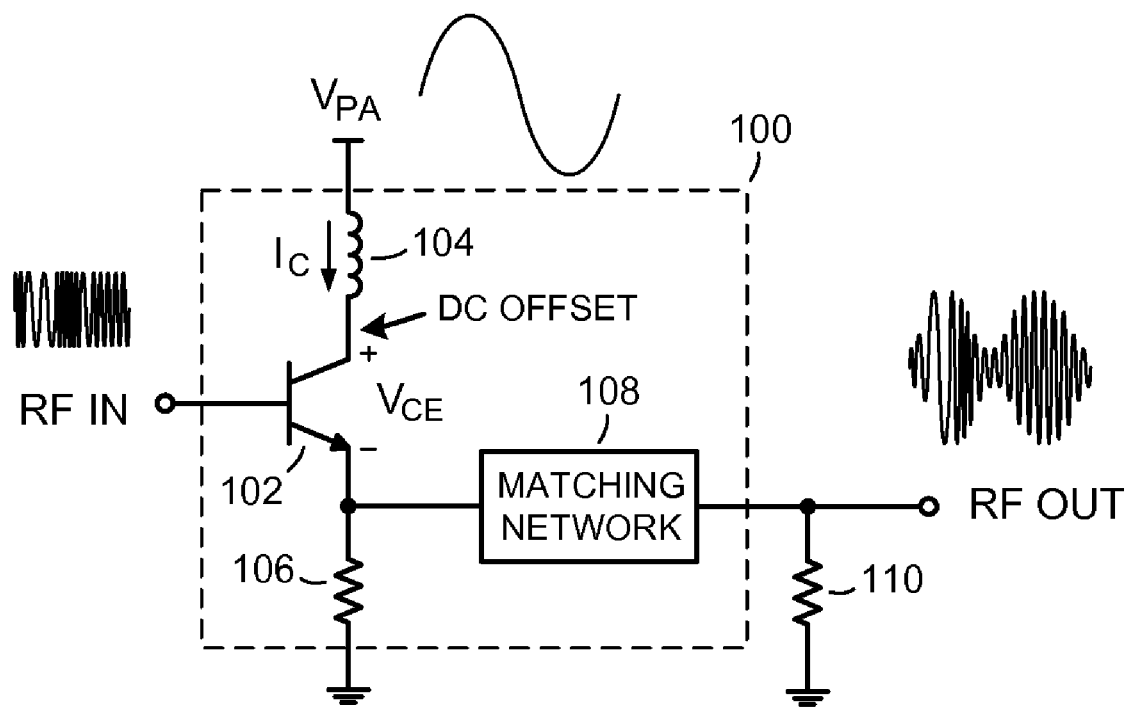
FIG. 1 is a schematic diagram of a conventional switch-mode radio frequency power amplifier (RFPA)
Figure 2:
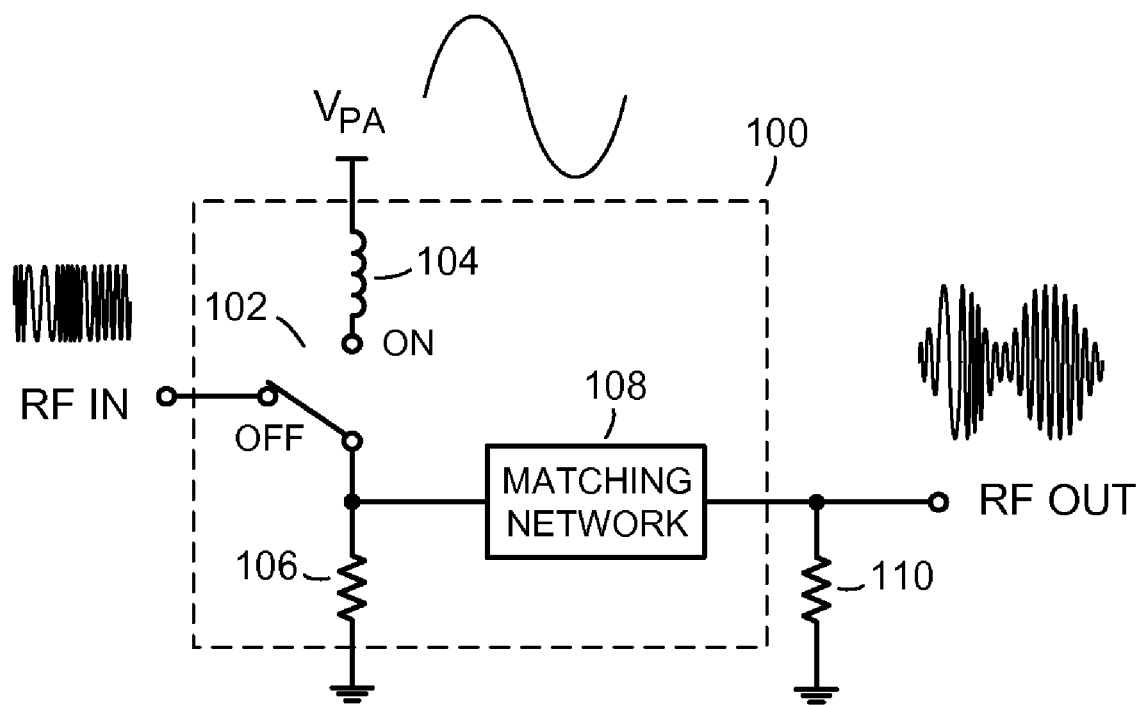
FIG. 2 is a simplified schematic diagram of the conventional switch-mode RFPA in FIG. 1, highlighting the operation of the switch-mode RFPA's transistor as a switch.
Figure 3:
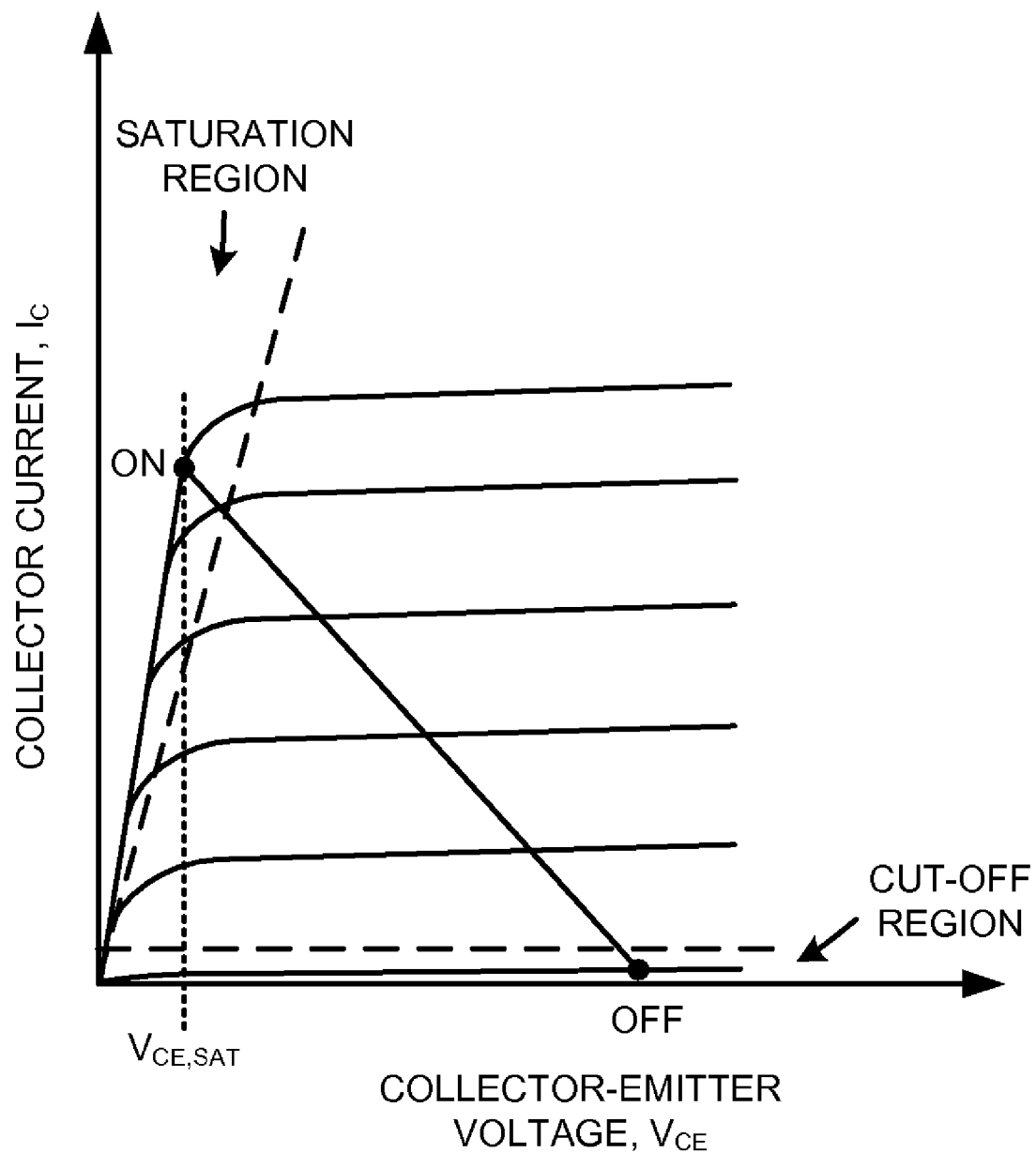
FIG. 3 is a drawing of the characteristic curves of a typical bipolar junction transistor, and the ON and OFF states of the bipolar junction transistor when the transistor is operated as a switch, such as in a switch-mode RFPA.
Figure 4:
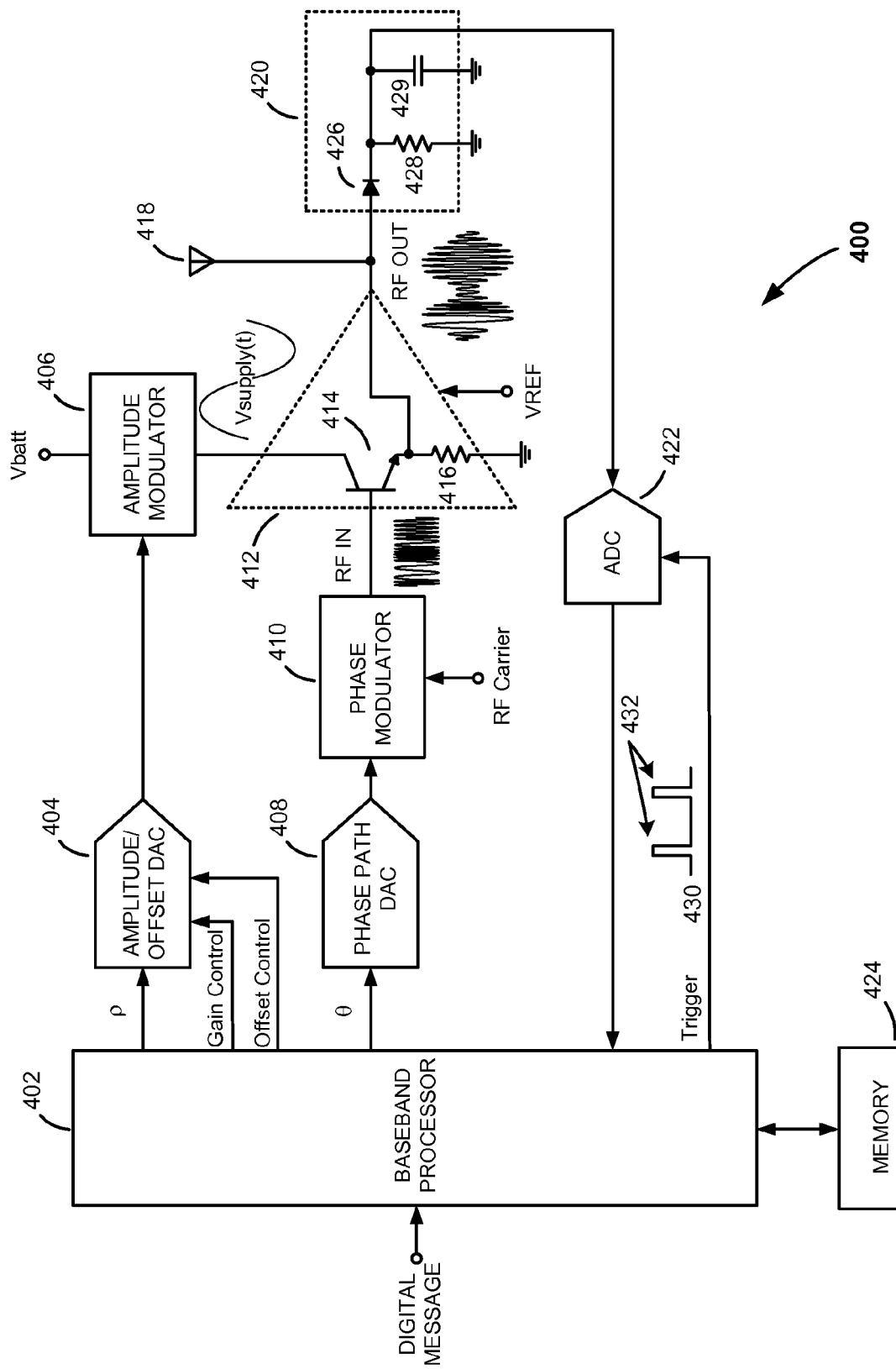
FIG. 4 is a drawing of a polar transmitter, according to an embodiment of the present invention.

Referring first to FIG. 4, there is shown a polar transmitter 400 according to an embodiment of the present invention. The polar transmitter 400 comprises a baseband processor 402; an amplitude modulation (AM) path including an amplitude/offset digital-to-analog converter (DAC) 404 and amplitude modulator 406; a phase modulation (PM) path including a phase path DAC 408 and phase modulator 410; a switch-mode RFPA 412 including a transistor 414 (in one embodiment, a heterojunction bipolar transistor (HBT)) and bias resistor 416; an antenna 418; a detector 420; an analog-to-digital converter (ADC) 422; and a memory 424.

The baseband processor 402 comprises a digital integrated circuit, such as a microprocessor, microcontroller or other digital signal processor formed in an application specific integrated circuit or field programmable gate array. It is responsible for performing the digital signal processing functions of the polar transmitter 400, including generating digital amplitude and phase modulation data streams ρ and θ from a digital message to be transmitted, and formatting the digital amplitude and phase modulation data streams ρ and θ according to a predetermined modulation scheme.

During operation, the digital phase modulation data stream θ produced by the baseband processor 402 is fed to the input of the phase DAC 408 in the PM path of the polar transmitter 400. The phase DAC 408 converts the digital phase modulation data stream θ into an analog PM signal based on the phase modulation levels represented in the digital phase modulation data stream θ. The phase modulator 410 modulates an RF carrier signal according to the PM in the analog PM signal, producing a constant-envelope phase-modulated RF carrier signal, which is coupled to the base of the transistor 414 of the switch-mode RFPA 412. The base of the transistor 414 serves as the RF input (RF IN) to the switch-mode RFPA 412. The switch-mode RFPA 412 in this exemplary embodiment comprises a single amplifier. However, it may alternatively comprise a multi-stage amplifier that includes a cascade of amplifiers, in which case the switch-mode RFPA 412 would serve as the final amplifier stage.

While the constant-envelope phase-modulated RF carrier signal is being generated in the PM path of the polar transmitter 400, an amplitude modulated power supply signal Vsupply(t) containing the AM is generated in the AM path. Specifically, based on the amplitude modulation levels represented in the digital amplitude modulation data stream ρ, the amplitude/offset DAC 404 converts the digital amplitude modulation data stream ρ into an analog AM signal. The amplitude modulator 406, which may comprise a linear regulator or a switching regulator, then modulates a DC power supply voltage Vbatt (e.g., as provided by the polar transmitter's battery) according to the AM in the analog AM signal. The resulting and amplitude modulated power supply signal Vsupply(t) is applied to the collector of the transistor 414 of the switch-mode RFPA 412. As will be explained in more detail below, the DC level and/or lower and/or upper magnitudes of the analog AM signal is(are) adjusted (e.g., by offset and gain control signals from the baseband processor 402) to compensate for DC offset variation of the switch-mode RFPA 412 and/or to compensate for other process-voltage-temperature (PVT) related influences that adversely affect the accuracy of the signal envelope at the RF output of the polar transmitter 400.

The switch-mode RFPA 412 responds to the constant-envelope phase-modulated RF carrier signal produced in the PM path, switching the transistor 414 between saturated (ON) and cut-off (OFF) states while the amplitude modulated power supply signal Vsupply(t) from the AM path modulates the collector of the transistor 414 of the switch-mode RFPA 412. The emitter of the transistor 414 in this exemplary embodiment serves as the RF output (RF OUT) of the switch-mode RFPA 412, providing the desired amplitude- and phase-modulated RF output signal after being filtered by a matching network (not shown in the drawing). The bias resistor 416 is biased so that the voltage dropped across it is greater than or equal to nominal DC offset voltage of the transistor when in the ON state.

Whereas the switch-mode RFPA 412 is shown as being configured in a common-collector (i.e., emitter follower) topology, it may be alternatively configured in a common-emitter topology, as will be appreciated by those of ordinary skill in the art. Further, whereas the switch-mode RFPA 412 is shown as comprising a single transistor 414 (similar to a Class-E switch-mode RFPA), it may be alternatively implemented using a plurality of transistors, similar to as in a Class-D or a Class-F type switch-mode RFPA. Still further, whereas the transistor 414 is shown to comprise a bipolar transistor, it may alternatively comprise a field-effect transistor (FET) of some sort, such as a pseudomorphic high electron mobility transistor (pHEMT), for example.

The detector 420 is coupled to the RF output terminal RF OUT of the switch-mode RFPA 412. It includes a diode 426, a resistor 428 and a capacitor 429. The diode 426 prevents current from flowing back to the input of the envelope detector 420. The capacitor 429 operates to store charge on rising edges of the amplitude- and phase-modulated RF output signal and release the charge slowly through the resistor 428 on falling edges. In this manner, the signal envelope of the amplitude- and phase-modulated RF output signal at the RF output of the polar transmitter 400 is detected, i.e., is separated from the RF. While the detector 420 in this exemplary embodiment comprises an envelope detector, other types of voltage or power detectors may be used, as will be appreciated by those of ordinary skill in the art.

During operation, the ADC 422 is configured to sample the signal envelope of the amplitude- and phase-modulated RF output signal produced at the output of the detector 420. Each digital sample is taken at a time when a corresponding predetermined signal characteristic in the analog AM signal (such as a high or low magnitude event) has completed propagating from the output of the amplitude/offset DAC 404 and appears at the output of the detector 420. The baseband processor 402 is configured to read each digital sample generated by the ADC 422, in response to a trigger signal 430 sent from the baseband processor 402. The baseband processor 402 generates triggers 432 in the trigger signal 430 in response to samples in the digital amplitude modulation data stream ρ that have been identified to represent and correspond to the aforesaid predetermined signal characteristic in the analog AM signal. To account for the propagation delay between the output of the amplitude/offset DAC 404 and the input of the ADC 422 (approximately equal to the delay between the output of the amplitude/offset DAC 404 and the RF output of the switch-mode RFPA 412, if the delay of the detector 420 is neglected), and ensure that the signal envelope of the amplitude- and phase-modulated RF output signal is sampled at the appropriate time, the trigger signal 430 is delayed by a time corresponding to the propagation delay. The propagation delay and the corresponding required delay of the trigger signal 430 is easily measured during test and manufacturing, for example using a two-channel oscilloscope that allows the analog AM signal at the output of the amplitude/offset DAC 404 to be compared to the signal envelope of the amplitude- and phase-modulated RF output signal at the output of the detector 420.

Figure 5:
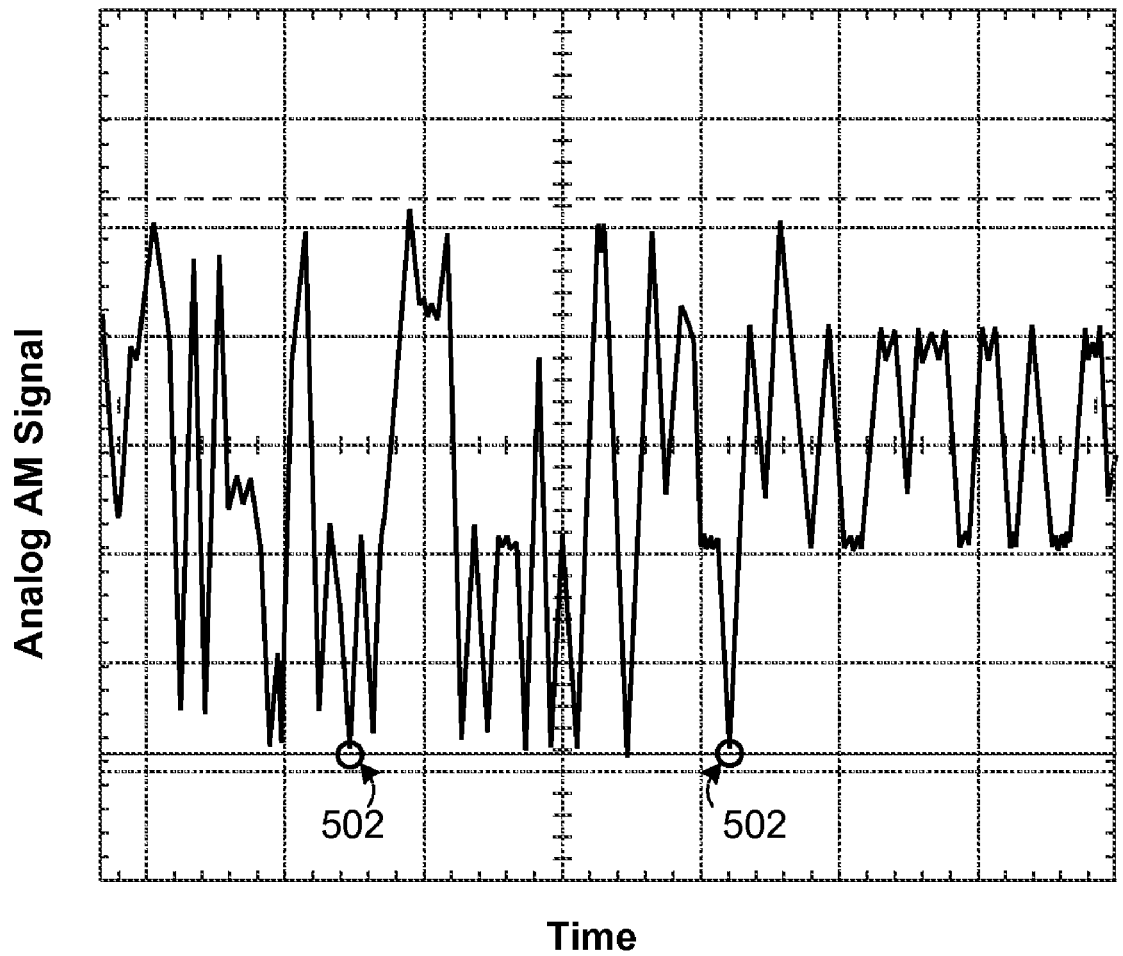
FIG. 5 is a drawing of an exemplary analog amplitude modulation (AM) signal such as might appear at the output of the amplitude/offset digital-to-analog converter (DAC) of the polar transmitter in FIG. 4, and which includes low magnitude events which are used to control the sampling of the signal envelope of the amplitude- and phase-modulated signal produced at the output of the detector.

DC offset drift of the transistor 414 in the switch-mode RFPA 412 and/or other process-voltage-temperature (PVT) related signal variations can cause the envelope of the amplitude- and phase-modulated RF output signal produced at the output of the detector 420 to deviate a nominal or expected value. For example, when the predetermined signal characteristic in the analog AM signal is defined as corresponding to a low magnitude event 502 in the analog AM signal, such as illustrated in FIG. 5, DC offset drift and/or other PVT-related influences can cause the magnitude of the low magnitude event, after having propagated from the output of the amplitude/offset DAC 404 to the output of the detector 420, to have an "actual" magnitude that is different from an expected magnitude (such as an expected magnitude determined in a factory calibration process). As will be explained in more detail below, to reduce this error, the baseband processor 402 compares the digital samples from the ADC 422, which represent the actual magnitude of the low magnitude events 502 at the output of the detector 420, to a digital representation of an expected magnitude stored in the memory 424. Based on the comparison, the baseband processor 402 then determines what the gain and/or offset control settings to the amplitude/offset DAC 404 need to be in order to reduce the error.

Because the switch-mode RFPA 412 is configured to operate between saturated and cut-off states, the output power level of the polar transmitter 400 is dependent upon and determined by the magnitude of the analog AM signal. Consequently, the expected value of some types of predetermined signal characteristics may change depending on what output power level the polar transmitter 400 is configured to operate. For example, when the predetermined signal characteristic is defined as corresponding to a low magnitude event 502 in the analog AM signal, such as in FIG. 5, the low magnitude event 502 in the analog AM signal has a magnitude that depends on what output power level the polar transmitter 400 is configured to operate. Accordingly, to account for any dependency the predetermined signal characteristic may have on output power level, the memory 424 is configured to store a look up table (LUT) containing expected values of the predetermined signal characteristic for a plurality of different output power levels.

Figure 6:
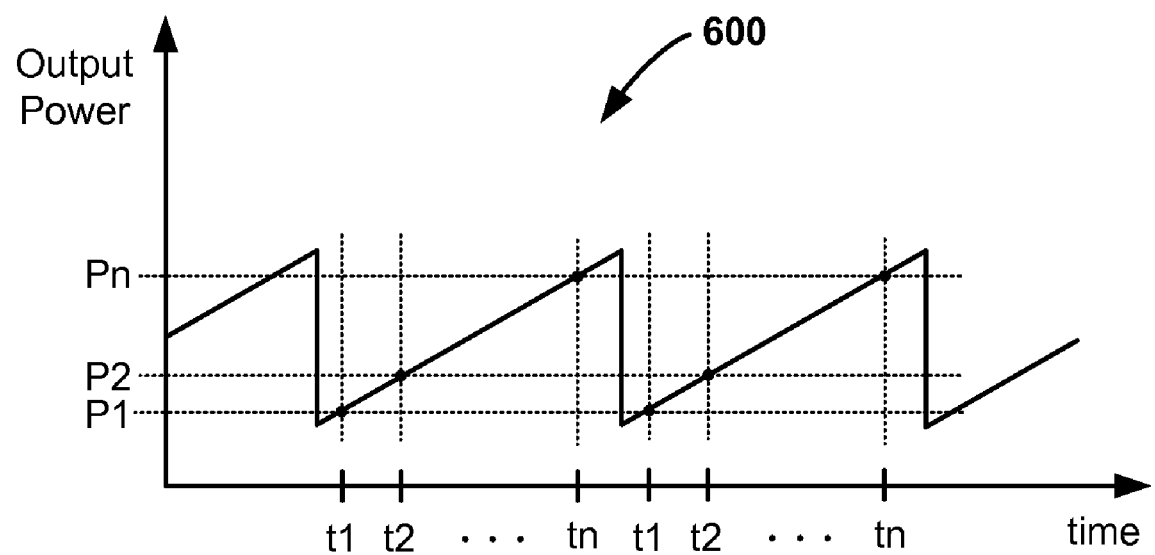
FIG. 6 is a drawing of an exemplary AM test pattern, which may be used in a pre-operation calibration process to determine a plurality of expected values of a predetermined signal characteristic for a plurality of different output powers P1, P2, . . . , Pn-1, Pn the polar transmitter in FIG. 4 can be configured to transmit.

According to one embodiment of the invention, the LUT is determined in a pre-operation calibration process. The calibration process involves measuring a plurality of output powers P1, P2, . . . , Pn-1, Pn at ambient temperature in response to a test pattern, such as the sawtooth AM test pattern 600 shown in FIG. 6. For each of the measured output powers P1, P2, . . . , Pn-1, Pn, a digital sample representing an expected value of the predetermined signal characteristic is acquired through the ADC 422. Digital representations of the expected values of the predetermined signal characteristic, i.e., ADC1, ADC2, . . . , ADCn-1, ADCn for each of the measured output powers P1, P2, . . . , Pn-1, Pn are generated through the ADC 422. Finally, the calibration results representing the expected values are organized in a LUT 700 (as illustrated in FIG. 7) and stored in the memory 424 for use during normal operation.

Figure 8:
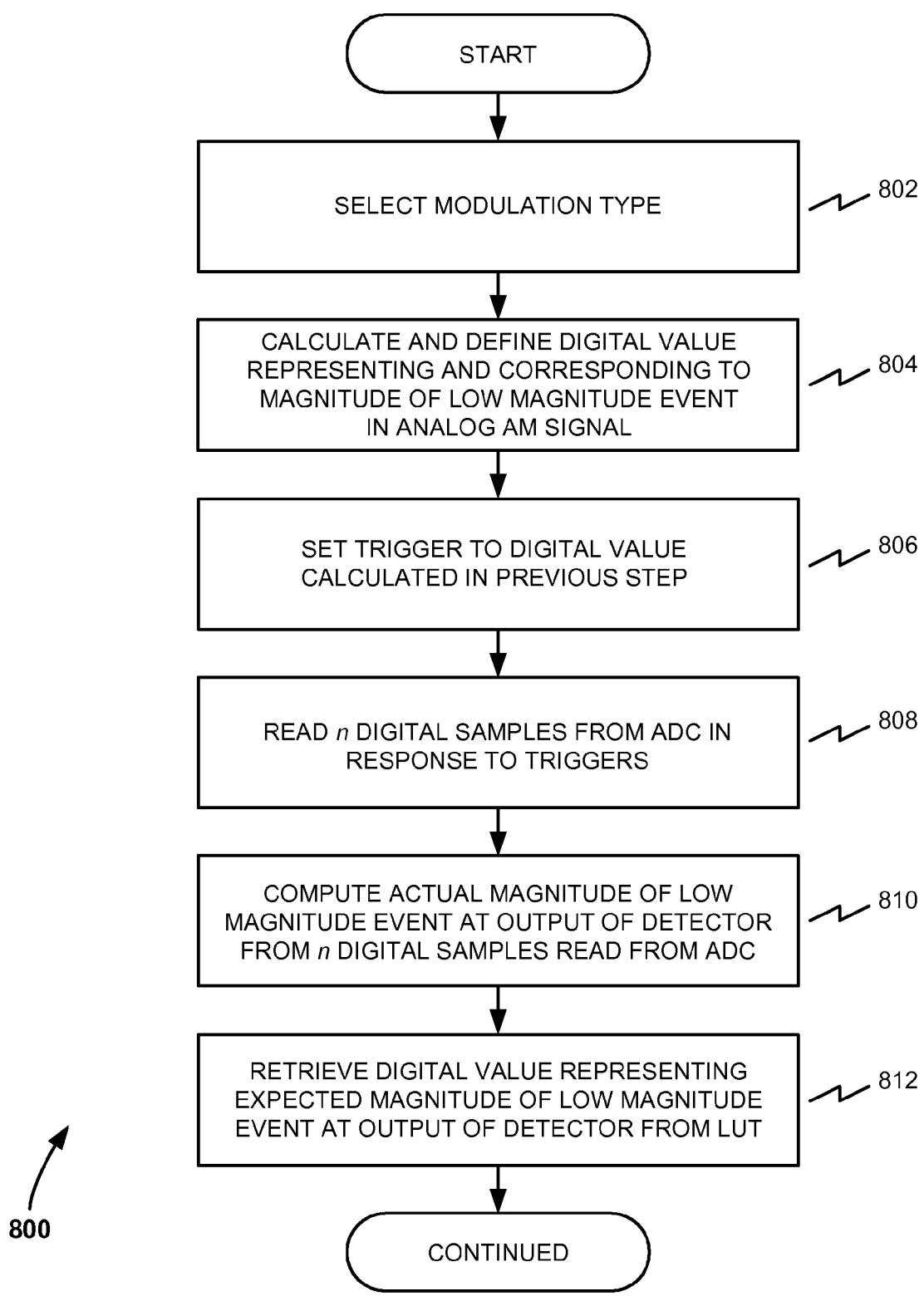
FIG. 8 is a flowchart illustrating an exemplary DC offset compensation method performed by the polar transmitter in FIG. 4, according to an embodiment of the present invention.
Figure 8:
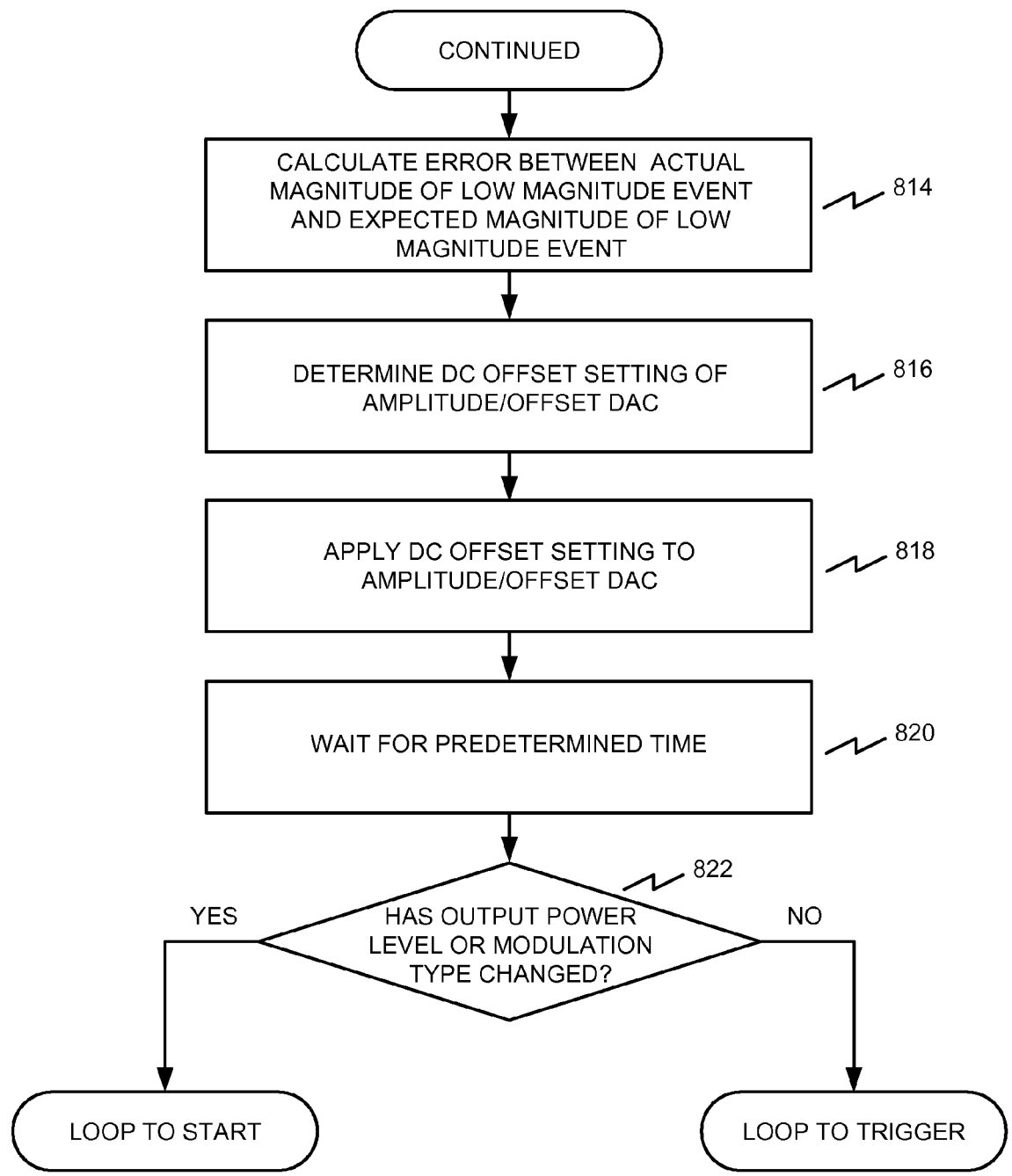

FIG. 8 is a flowchart illustrating an exemplary DC offset compensation method 800 performed by the polar transmitter 400 in FIG. 4 using the principles of the invention described above, according to an embodiment of the present invention. The method 800 is described with reference to FIG. 5, which as explained above is a depiction of an analog AM signal such as might appear at the output of the amplitude/offset DAC 404. The low magnitude events 502 in the analog AM signal are the predetermined signal characteristic that the baseband processor 402 identifies and responds to to generate the trigger 432 of the trigger signal 430.

At a first step 802 in the method 800, the baseband processor 402 selects the type of modulation to be used. (Here it is assumed that the polar transmitter 400 comprises a multi-mode transmitter configurable to operate according to a plurality of different modulation types. In a polar transmitter configurable to operate according to only a single modulation type, this step would be omitted.)

Next, at step 804 the baseband processor 402 calculates and defines a digital value representing and corresponding to the magnitude of the low magnitude events 502 in the analog AM signal for the type of modulation selected in step 802 and for the output power level the polar transmitter 400 is currently configured to transmit.

At step 806 the baseband processor 402 sets the triggers 432 of the trigger signal 430 so that the triggers 432 correspond to the low magnitude events 502 in the analog AM signal. As was explained above, the trigger signal 430 is delayed by a time corresponding to the propagation delay between the output of the amplitude/offset DAC 404 and the output of the detector 420, so that the ADC 422 is triggered at the appropriate time.

At step 808 the baseband processor 402 reads n digital samples from the ADC 422, in response to n consecutive triggers 432 in the trigger signal 430, where n is an integer and n≧1. Each of the n digital samples from the ADC 422 provides a separate digital representation of the actual (i.e., measured) magnitude of a low magnitude event 502 after it has propagated from the output of the amplitude/offset DAC 404 to the output of the detector 420.

At step 810 the baseband processor 402 averages the n digital samples collected from the ADC 422, to provide an averaged digital sample representing the actual magnitude of the signal envelope produced at the output of the detector 420. In most circumstances, the averaged digital sample serves to provide the most accurate digital representation of the actual magnitude of the signal envelope. However, in some cases a single digital sample (i.e., n=1) may provide sufficient accuracy.

At step 812 a digital value representing the expected magnitude of the low magnitude event at the output of the detector 420 (one of ADC1, ADC2, ..., ADCn-1, ADCn in FIG. 7) is retrieved from the LUT stored in the memory 424. The LUT may be indexed either by output power level (P1, P2, ..., Pn-1, Pn in the LUT 700 in FIG. 7) or by the digital value representing and corresponding to the magnitude of the low magnitude events 502 calculated in step 804 above (i.e., DAC1, DAC2, ... DACn-1, DACn in the LUT 700 in FIG. 7). Because the LUT only contains a limited number of entries, interpolation between entries in the LUT may be used to improve accuracy, as will be understood by those of ordinary skill in the art.

At step 814 the baseband processor 402 compares the digital value representing the expected low magnitude retrieved from the LUT in step 812 to the digital sample representing the actual magnitude determined in step 810. Comparing the two digital values results in an error indicative of the degree to which the DC value of the amplitude- and phase-modulated RF output signal has drifted from its expected value.

At step 816 the baseband processor 402 uses the digital error determined in step 814 to calculate the value of the DC offset control signal that needs to be applied to the amplitude/offset DAC 404 to compensate for the drift (i.e., to reduce the error).

At step 818 the DC offset control signal calculated in step 816 is applied to the amplitude/offset DAC 404 to compensate for the DC offset drift.

DC offset drift and other PVT-related influences on the envelope of the amplitude- and phase-modulated RF output signal envelope typically occur very slowly over time compared to the rate at which the low magnitude events 502 occur in the analog AM signal. Consequently, accurate drift compensation does not require that digital samples be read from the ADC 422 every time a low magnitude event 502 occurs in the analog AM signal in order to properly compensate for the drift. Rather, after digital samples are read from the ADC 422 in step 808 above, at step 820 the baseband processor 402 may be, although not necessarily, configured to temporarily suspend triggering the ADC 422 for a predetermined "wait" time. Reducing the sampling rate in this manner is beneficial, since it reduces the load on the baseband processor 402 and avoids unnecessary power dissipation.

After the wait period has expired in step 820, a query is made at step 822 as to whether the modulation type or output power level has changed since the last sampling period. If neither has changed (i.e., "no"), the method 800 loops back to step 808 and a new sampling period is commenced. If either has changed (i.e., "yes"), the method 800 loops back to the start of the method 800 and the conditions for generating the trigger signal 430 are redefined according to the new modulation type and/or the new output power level, beginning with step 802.

The method 800 described in FIG. 8 above operates to reduce envelope inaccuracies caused by DC offset drift by introducing a countering DC offset into the analog AM signal via an offset control input of the amplitude/offset DAC 404. The countering DC offset is transferred to the collector of the transistor 414 of the switch-mode RFPA 412 (via the amplitude modulator 406) to oppose the DC offset drift. In an alternative embodiment, the digital error determined in step 814 is used to modify the bias voltage VREF of the switch-mode RFPA 412. Varying the bias voltage VREF causes the switch-mode RFPA 412 to operate at a different operating point, thereby compensating for the DC offset drift in a different way.

Figure 9:
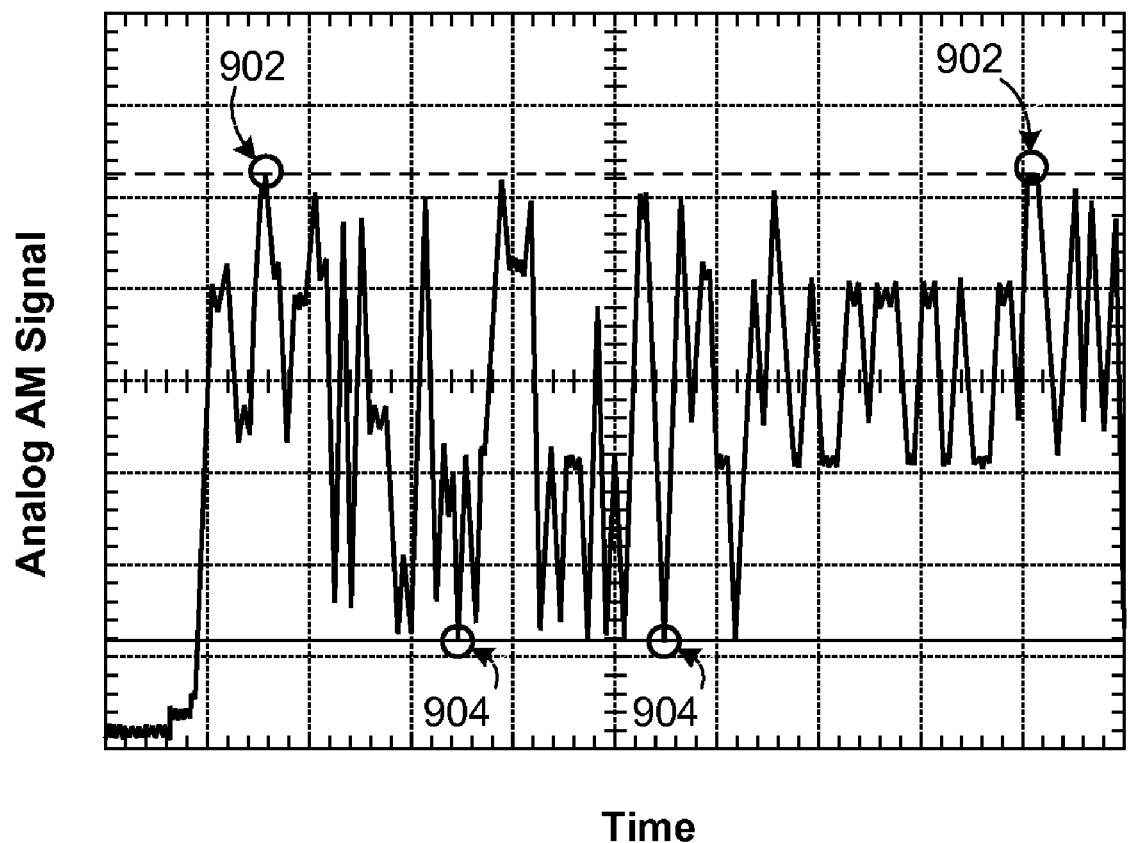
FIG. 9 is a drawing of an exemplary analog AM signal such as might appear at the output of the amplitude/offset DAC of the polar transmitter in FIG. 4, and which includes upper and lower peak amplitude events which are used to control the sampling of the signal envelope of the amplitude- and phase-modulated signal produced at the output of the detector.

The method 800 described in FIG. 8 also focuses on compensating for DC offset drift. However, the method 800 may be adapted to correct other types of signal deviations such as amplitude, peak-to-peak amplitude deviations or deviations of RF output power from expected RF output powers. For example, to compensate for a deviation of the peak-to-peak amplitude of the amplitude- and phase-modulated RF output signal envelope at the RF output of the polar transmitter 400, first and second signal characteristics, such as upper and lower peak amplitude events 902 and 904 in the analog AM signal in FIG. 9, can be used to generate the trigger signal for the ADC 422. Digital samples collected from the ADC 422 represent the actual peak-to-peak amplitude of the amplitude- and phase-modulated RF output signal. The baseband processor 402 would then compare the actual peak-to-peak amplitude represented by the digital samples to an expected peak-to-peak amplitude, to determine what level of gain adjustment needs to be applied to the amplitude/offset DAC 404 to reduce or increase the peak-to-peak amplitude deviation. To reduce the dynamic range requirements of the detector 420, two detectors of narrower dynamic range can be used, each being responsible for detecting only one of the upper peak amplitude or lower peak amplitude of the amplitude- and phase-modulated RF output signal.

Although the present invention has been described with reference to specific embodiments, those embodiments are merely illustrative and not restrictive of the present invention. Further, various modifications or changes to the specifically disclosed exemplary embodiments will be suggested to persons skilled in the art and are to be included within the spirit and purview of this application and scope of the appended claims.

What is claimed is:

1. A method of compensating for signal variations in a communications transmitter employing a switch-mode power amplifier (PA), comprising:
   identifying a predetermined signal characteristic in an input signal applied to an input of the switch-mode PA;
   sampling a modulated signal containing the identified predefined signal characteristic produced at an output of said switch-mode PA to generate a digital sample representing an actual value of said identified predefined signal characteristic;
   comparing said digital sample representing said actual value of said identified predetermined signal characteristic to a digital value representing an expected value; and
   compensating for signal variations in said modulated signal based on the comparison of said digital sample representing said actual value to said digital value representing said expected value.

2. The method of claim 1 wherein compensating for signal variations in said modulated signal comprises compensating for a direct current (DC) offset drift of a DC offset voltage in said switch-mode PA.

3. The method of claim 1 wherein compensating for signal variations in said modulated signal comprises modifying said input signal, based on the comparison of said digital sample representing said actual value to said digital value representing said expected value.

4. The method of claim 1 wherein compensating for signal variations in said modulated signal comprises modifying a bias voltage of said switch-mode PA, based on the comparison of said digital sample representing said actual value to said digital value representing said expected value.

5. The method of claim 1 wherein compensating for signal variations in said modulated signal comprises compensating for a deviation in output power of said switch-mode PA from a desired output power.

6. The method of claim 1 wherein sampling the modulated signal comprises:
sampling a plurality of occurrences of a predetermined signal characteristic at the output of said switch-mode PA to generate a plurality of digital samples representing said predetermined signal characteristic; and
generating a digital sample representing the actual value of said predetermined signal characteristic from said plurality of digital samples.

7. The method of claim 1 wherein said predetermined signal characteristic corresponds to a magnitude of said input signal.

8. The method of claim 1 wherein said input signal comprises an input signal containing amplitude modulation.

9. The method of claim 1 wherein sampling the modulated signal is performed based on the identified predetermined signal characteristic in said input signal.

10. A polar transmitter, comprising:
a baseband processor configured to generate a digital amplitude modulation (AM) data stream, generate a digital phase modulation (PM) data stream, and identify samples in said digital AM data stream representing a predetermined signal characteristic;
a first digital-to-analog converter (DAC) configured to generate an analog AM signal having the predetermined signal characteristic from said digital AM data stream;
a second DAC configured to generate an analog PM signal from said PM data stream;
an amplitude modulator configured to receive said analog AM signal and generate an amplitude modulated power supply signal;
a phase modulator configured to receive said analog PM signal and generate a phase-modulated carrier signal;
a switch-mode power amplifier (PA) having a first input configured to receive an amplitude modulated power supply signal, a second input configured to receive a phase modulated signal, and an output configured to provide an amplitude- and phase-modulated output signal; and
a compensation loop coupled between the output of the switch-mode PA and an input of said baseband processor operable to generate a digital sample of said amplitude- and phase-modulated output signal at approximately the same time said predetermined signal characteristic has propagated from said first DAC and arrived at the output of said switch-mode PA, said digital sample representing an actual value of said signal characteristic at the output of said switch-mode PA,
wherein said baseband processor is configured to modify the analog AM signal, based on the actual value represented by said digital sample to compensate for signal variations that affect an envelope accuracy of a signal envelope of said amplitude- and phase-modulated output signal.

11. The polar transmitter of claim 10 wherein said compensation loop comprises:
a detector coupled to the output of said switch-mode PA configured to detect said signal envelope; and
an analog-to-digital converter (ADC) configured to generate said digital sample.

12. The polar transmitter of claim 11 wherein said ADC is configured to generate said digital sample in response to a trigger signal generated by said baseband processor, said baseband processor configured to generate said trigger signal in response to a sample identified in said digital AM data stream representing said predetermined signal characteristic.

13. The polar transmitter of claim 10 wherein said digital sample provides a measure of an extent to which a direct current offset of the switch-mode PA deviates from or has drifted from an expected DC offset.

14. The polar transmitter of claim 10, further comprising a memory in communication with said baseband processor configured to store a digital value representing an expected value, which said baseband processor accesses and compares to the digital sample representing said actual value to compensate for signal variations that affect the envelope accuracy of the signal envelope of said amplitude- and phase-modulated output signal.

15. The polar transmitter of claim 10 wherein said baseband processor is configured to compensate for said signal variations by controlling gain and/or direct current (DC) offset settings of said first DAC based on a comparison of the digital sample representing said actual value to a digital value representing an expected value of said signal characteristic at the output of said switch-mode PA.

16. The polar transmitter of claim 10 wherein said baseband processor is configured to compensate for said signal variations by controlling a bias voltage based on a comparison of the digital sample representing said actual value to a digital value representing an expected value of said signal characteristic at the output of said switch-mode PA.

17. The polar transmitter of claim 10 wherein compensating for said signal variations comprises compensating for a direct current (DC) offset drift of a DC offset voltage in said switch-mode PA.

18. The polar transmitter of claim 10 wherein compensating for said signal variations comprises compensating for a deviation in output power of said switch-mode PA from a desired output power.

19. The polar transmitter of claim 10 wherein said compensation loop is configured to generate multiple digital samples of said amplitude- and phase-modulated output signal at approximately the same times multiple occurrences of said predetermined signal characteristic have propagated from said first DAC and arrived at the output of said first DAC, and said baseband processor is configured to form a digital sample representing said actual value from said multiple digital samples.

20. A switch-mode power amplifier (PA) apparatus, comprising:
a switch-mode PA having an input configured to receive an input signal with a predetermined signal characteristic and an output configured to provide an output signal containing said predetermined signal characteristic; and
a circuit coupled to the output of said switch-mode PA configured to sample said output signal at approximately the same time said predetermined signal characteristic appears at the output of said switch-mode PA, wherein said circuit comprises:
a detector configured to detect said output signal; and
an analog-to-digital converter (ADC) configured to sample the output signal detected by said detector.

21. The switch-mode PA apparatus of claim 20 wherein one or more samples provided by said ADC are used to determine to what extent said output signal deviates from an expected output signal due to process, voltage or temperature influences.

22. The switch-mode PA apparatus of claim 20 wherein one or more samples provided by said circuit are used to compensate for process, voltage or temperature influences that cause the output signal to deviate from a desired output signal.

23. A polar transmitter including the switch-mode PA apparatus claimed in claim 20.

* * * * *